United States Patent [19]
Gregerson

[11] Patent Number: 5,273,159
[45] Date of Patent: Dec. 28, 1993

[54] WAFER SUSPENSION BOX

[75] Inventor: Barry Gregerson, Chanhassen, Minn.

[73] Assignee: Empak, Inc., Chanhassen, Minn.

[21] Appl. No.: 887,965

[22] Filed: May 26, 1992

[51] Int. Cl.$^5$ .................................................. B65D 85/48
[52] U.S. Cl. ....................................... 206/334; 206/454; 206/587
[58] Field of Search ........................ 206/328-334, 206/444, 454, 455, 587; 211/40, 41

[56] References Cited

U.S. PATENT DOCUMENTS

| | | | |
|---|---|---|---|
| 1,838,411 | 12/1931 | Knorpp | 206/589 |
| 4,043,451 | 8/1977 | Johnson | 206/334 |
| 4,043,504 | 7/1979 | Kudlich | 206/334 |
| 4,061,228 | 12/1977 | Johnson | 206/454 |
| 4,450,960 | 5/1984 | Johnson | 206/334 |
| 4,520,925 | 6/1985 | Johnson | 206/334 |
| 4,555,024 | 11/1985 | Voss et al. | 206/454 |
| 4,588,086 | 5/1986 | Coe | 206/444 |
| 4,653,636 | 3/1987 | Armstrong | 206/334 |
| 4,718,549 | 1/1988 | Rissotti et al. | 206/334 |
| 4,880,116 | 11/1989 | Kos | 206/454 |
| 4,966,284 | 10/1990 | Gregerson et al. | 206/444 |
| 4,973,488 | 12/1988 | Mortensen | 206/454 |
| 5,046,615 | 9/1991 | Nentl | 206/454 |

Primary Examiner—Jimmy G. Foster
Attorney, Agent, or Firm—Haugen and Nikolai

[57] ABSTRACT

A ridged, transparent, thermoplastic package for transporting substrate wafers is disclosed. The package includes elastomeric cushions which hold the substrate wafers in a manner which precludes them from becoming damaged during normal shipping and handling.

26 Claims, 10 Drawing Sheets

WAFER SUSPENSION BOX

BACKGROUND OF THE INVENTION

I. Field of the Invention

This invention relates to packages, and more particularly, to a substrate wafer package with replaceable resilient cushions between which the wafers are suspended to prevent sliding or pivoting of the wafers on the edge profile, thus eliminating particle generation and damage to the wafers.

II. Description of the Prior Art

A variety of packages for holding and transferring substrate wafers are known in the prior art. For example, U.S. Pat. No. 5,046,615 to Nentl discloses a disc shipper device utilizing downwardly extending dentate leaves or resilient flanges in a row of crenate scallops in the cover to maintain the wafers or discs in an up-right parallel spaced part alignment and provide secure positioning of the discs to prevent transverse or lateral motion within the last shipper.

U.S. Pat. No. 4,966,284 to Gregorson et al., discloses a substrate package container for storing and transporting substrate wafers. The container disclosed in this patent includes opposing rows of articulated cantilevered horizontal arms with centered V-grooves on each end for engaging the wafer.

U.S. Pat. No. 4,793,488 to Mortensen discloses a two part package for storing and transporting semiconductor wafers. This package contains a plurality of wafer contactors which exert a spring pressure against the wafers to secure the wafers in place.

U.S. Pat. No. 4,653,636 to Armstrong discloses a high temperature wafer boat. This wafer boat contains conventional ribs and a bottom supporting rib, side supporting rails and side retaining rails. These rails have aligned grooves to maintain the positioning of the wafers.

U.S. Pat. No. 4,588,086 to Koez discloses a two-part substrate carrier having a transparent lid. The base portion contains semicircular V-shaped grooves. The cover also includes V-shaped grooves for engaging the top of the wafer.

The Voss et al. U.S. Pat. No. 4,555,024 discloses a packaging unit for semiconductor wafers which contains spring tongues in the base to support surfaces and inwardly projecting retention cones in the lid. The wafers are fixed at only four contact points. The goal of this design is to maintain minimal contact with the wafer.

U.S. Patent 4,450,960 to Johnson discloses a package which is contoured and contains flexible fingers which space and secure the wafers and provides an upward pressure towards the package top with respect to the package bottom.

U.S. Pat. No. 4,160,504 to Kudlich describes a package having a plurality of parallel, laterally extending guide ribs formed opposite each other and a plurality of knobs which cooperate to maintain the discs in an upright position.

U.S. Pat. No. 4,043,451 to Johnson discloses still another shipping container for semiconductor wafers. The lid has interior wafer locating ribs and resilient, curved wafer supports beneath and over the edges of the wafer. The base contains an elongated panel of soft springy plastic with a corrugated wafer engaging face.

While significant improvements in wafer package technology are set forth in the prior art references discussed above, real problems continue to exist even with the use of these prior art packages. Many of these problems arise given the nature of the wafer substrates which they are designed to contain. Such substrate wafers are easily breakable, easily scratched, and are therefore very fragile. They are easily damaged by particles or other environmental contamination. Certain other prior art packages described above can protect the wafers from the external environment. However, when such packages are used, the wafers have become damaged due to the packaging itself and from the internal environment of the package which becomes contaminated by particles which are generated as the wafers pivot, slide or rotate on their edge profiles in the package. Such internal contamination becomes more prevalent as the thermoplastics used to cushion or retain the substrate wafers in the package lose their elastic memory so that the wafers are no longer securely held. When such flexural creep occurs, the packaged wafers can pivot or slide on their edge profiles generating particles which can damage or contaminate the wafer substrates. Thus, these packages cannot only damage the edges of the substrate wafers, but also the highly sensitive face surfaces used in the manufacturing of intragrated circuits.

The present invention overcomes the disadvantages of the prior art by providing a ridged transparent, thermoplastic package having a base and a cover. Located within the cover is a cushion made from an elastomeric or flexible thermoplastic material. An identical elastomeric or flexible thermoplastic cushion is associated with the base so that when the package is used, the substrate wafers are sandwiched between the elastomeric cushions and firmly held in place by them. The two cushions have an identical structure. Each has a base comprising a pair of parallel rails. Extending between the parallel rails are a plurality of wafer engaging member. Each wafer engaging member is resilient, yet deformable, to securely engage the edge of the wafer. Each also has angled surfaces extending outwardly on either side. The edge of the wafer is, thus, firmly secured between the angled, outwardly extending surfaces. When the box is closed, the wafers are firmly held between the cushion on the base and the cushion in the cover in such a way that the possibility of damage to the wafer is greatly reduced as compared to the prior art packages discussed above.

SUMMARY OF THE INVENTION

The general purpose of the present invention is to provide a package for wafer substrates which is sealable to prevent the wafers from being contaminated or damaged from the environment outside the box. Likewise, the purpose of the present invention is to provide such a wafer package which is capable of securing the wafers in such a way so that they are securely held in place and do not become damaged by the interior environment of the box due to particle generation.

Figure 2:
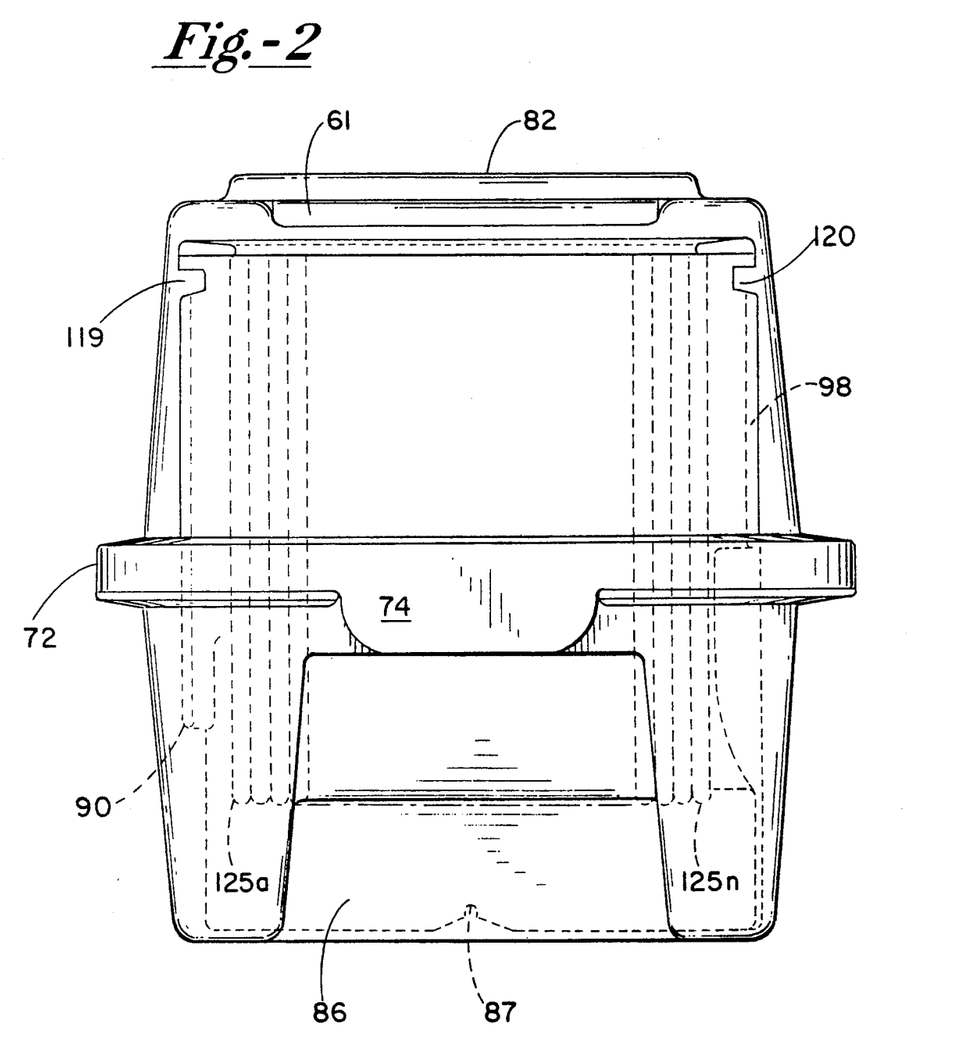
FIG. 2 is a side view of the substrate package showing a wafer carrier in hidden lines.

The package of the present invention consists essentially of three parts, a base, a cover, and cushion means. The cover and the base serve to fully enclose a cassette with wafers contained therein. Cassettes of the type contemplated are well known in the art. One example is shown in FIG. 2 of U.S. Pat. No. 4,966,284 to Gregorson discussed above. The use of these cassettes permits robotic handling of the wafers. The cassette to hold the set of wafers to be packaged is optional. An alternative embodiment eliminates the need for a cassette by incorporating a plurality of wafer pockets in the base's side walls. The base and cover can then be sealed to prevent contamination from the exterior of the package.

The present invention is differentiated from the prior art by the elastomeric or flexible thermoplastic cushions associated with the base and cover which are present to eliminate relative motion of the disc shaped wafers with respect to the various elements of the package during shipping. These cushions are made of an elastomeric or flexible thermoplastic material, are identical in configuration, and are replaceable. Each cushion is comprised of a pair of parallel rails with a plurality of extending, edge engaging members disposed between the parallel rails. When, for example, a cassette of wafers is placed in the base the lower edge of each wafer comes in contact with a separate extending member of the cushion. The extending members deflect to conform to the shape of the associated disc shaped wafer. The edge of the wafer becomes held between two angled surfaces which extend toward the wafer and receive the edge of the wafer. The cover is then placed on the base. As this is done, the extending members of the cushions associated with the cover engage the opposite surface of the wafers. The two cushions cooperate to firmly hold the discs in place so that they do not rub against interior structures of the box, creating particles which can then contaminate or damage the wafers. This is achieved because the cushions do not permit the wafers to pivot or slide or rotate on their edge profiles in the box.

With this summary in mind, it is clear that a principle object of the present invention is to provide a package for transporting and storing semiconductor wafers, discs or substrates.

A further object is to suspend a plurality of wafers in a package which absorbs some of the shock and a vibration experienced during shipment of the wafers.

Another object of the present invention is to provide a high technology, state of the art wafer package for storing and transporting semi-conductor wafers, discs or substrates which can be manipulated either manually or robotically.

Still another object of the present invention is to provide a wafer package which eliminates contamination of the wafers from the exterior environment during shipment and handling.

Another object of the present invention is to provide a wafer package which prevents the generation of particles inside the package which can contaminate or damage the fragile wafers.

Another object of the present invention is to provide a package which suspends the wafers between the elastomeric cushions to eliminate pivoting or sliding of the wafers and keeps the wafers from rubbing against internal structures of the package so that the wafers do not become contaminated.

A further object of the present invention is to provide elastomeric or flexible thermoplastic cushions which are easily replaceable and inserted.

Still another object of the invention is to provide cushions which have minimal flexural creep or lose elastic memory and are easily replaced so that the life of the package is increased.

A further object is to provide such resilient cushions in the base and cover of the package which are deformable to conform to the edge of the wafers to be held, and include angled surfaces which help center the edge of the wafer on the cushion.

Another object of the invention is to reduce the amount of padding required in secondary packaging and size therefore reducing shipping costs by securely cushioning the packaged wafers.

DESCRIPTION OF THE DRAWINGS

These and other objects of the invention will become more readily apparent from the following detailed description taken in conjunction with the accompanying drawings in which.

DETAILED DESCRIPTION OF THE PREFERRED EMBODIMENT

Figure 1:
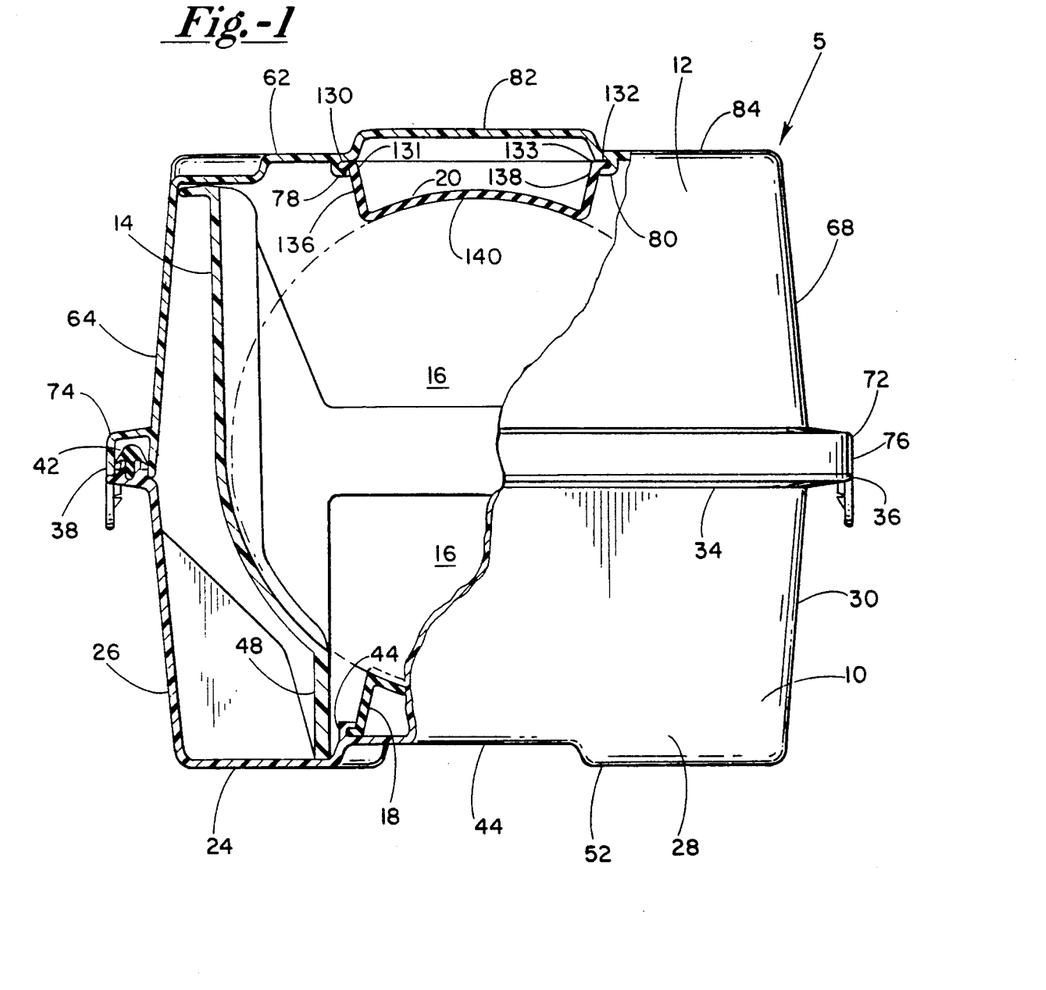
FIG. 1 is a front view of the substrate package partially cut away to show the wafer in a wafer carrier in the substrate package interior.

FIG. 1 shows a partially cut away front view of package 5. The package includes a bottom 10, a cover 12 and an internal wafer carrying cassette 14. Also shown is a wafer 16 located in cassette 14 and the end views of removable cushions 18 and 20 between which the wafers are firmly secured. FIG. 2 shows a side view of package 5 with the internal wafer carrying Cassette 14 shown in hidden line.

Figure 4:
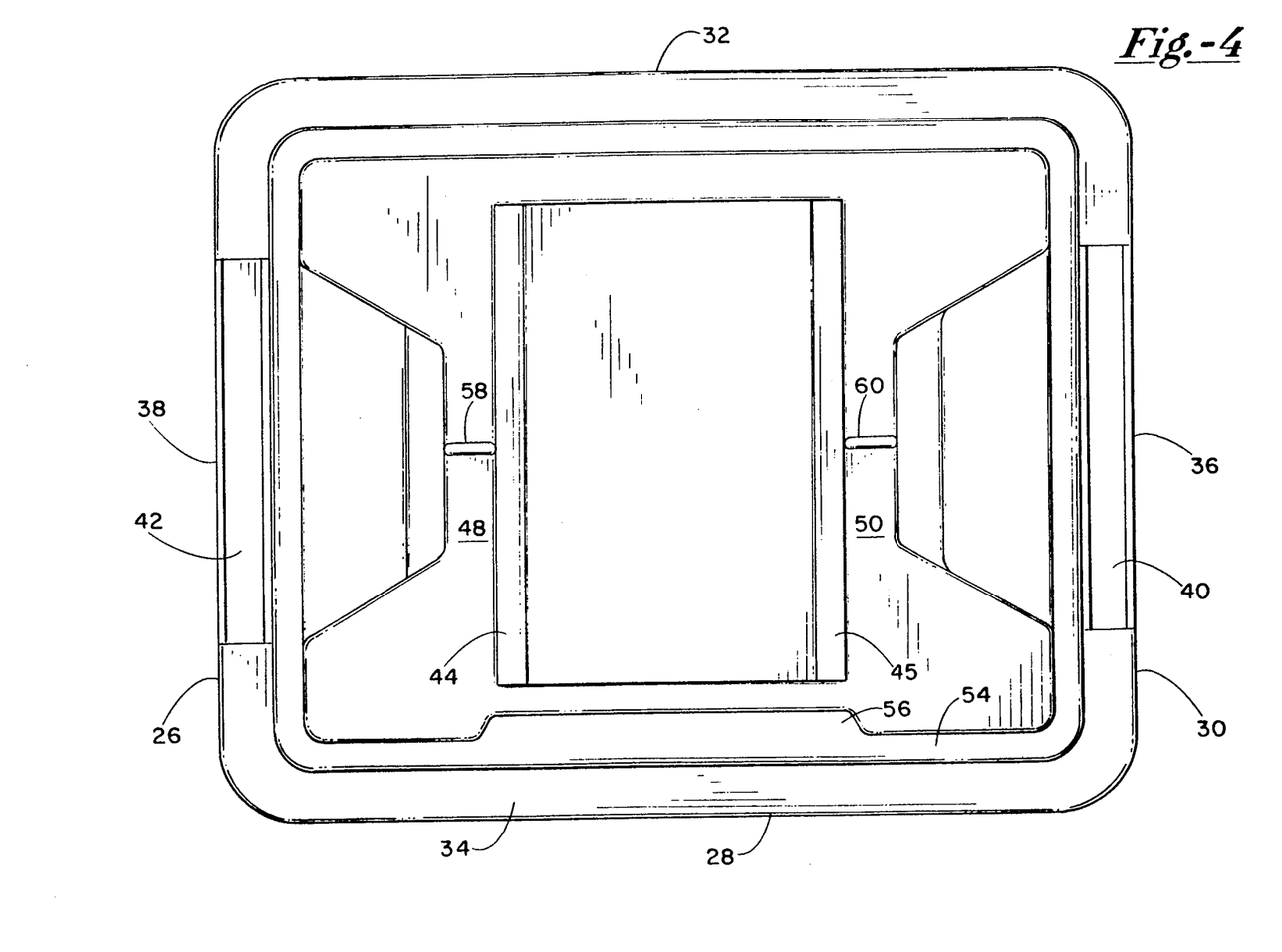
FIG. 4 is a top view of the bottom member of the invention's box.

The bottom 10 and cover 12 of package 5 are preferably made of a rigid and transparent thermoplastic for wafer visibility. The bottom 10, as shown in FIGS. 1, 2 and 4, has a bottom 24 and four integral walls 26, 28, 30 and 32 extending up from bottom 24. An outwardly projecting rim 34 to mate with a corresponding rim on cover 12 to be described later is located along the top of the walls 26, 28, 30 and 32. Rim 34 on opposing walls 26 and 30 contains latch members 36 and 38. The latches can be any suitable latches depending upon the packaging requirements. The package seam shown contain seals 40 and 42 for creating an airtight seal. The walls 26, and 30 are indented below the latch members at 37 and 39 for ease in human handling of the package.

Located on the upper planar surface on the inside surface 43 of bottom 24 are two L-shaped parallel cushion retaining tracks 44 and 45. On either side of the tracks are channels 48 and 50 on a lower planar surface 52. Each channel has a locator rib, 58 and 60 respectively, extending across the channel. A lip 54 is located along the interior surface of the locating walls. Lip 54 contains a locating index member 56 along wall 28. Index member 56 and ribs 58 and 60 are for accommodating the wafer cassette as later described in detail.

Figure 5:
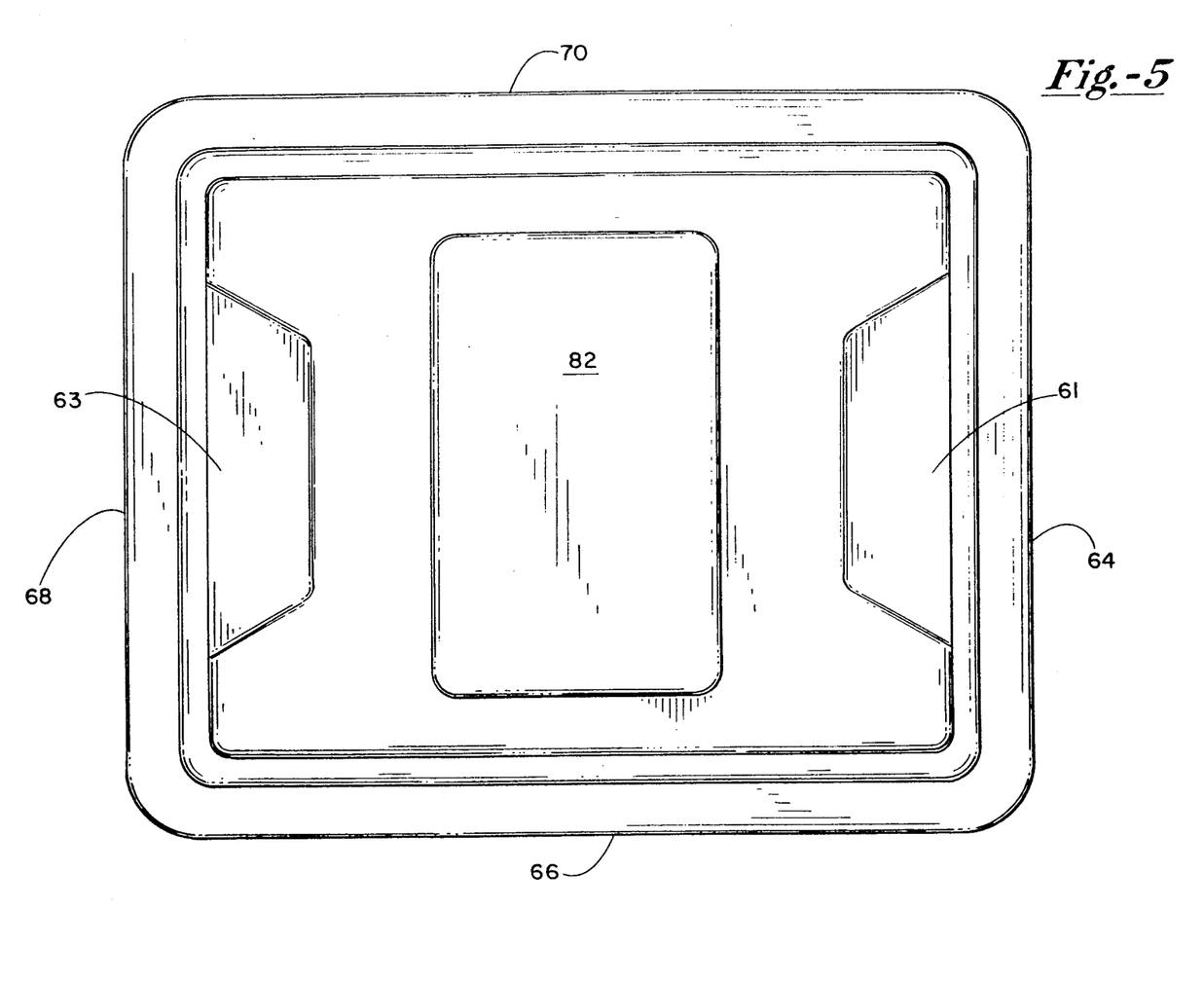
FIG. 5 is a top view of the top member of the invention's box.

The cover 12, as shown in FIGS. 1, 2 and 5, includes a base 62 with four integral walls 64, 66, 68 and 70. An outwardly projecting rim 72 is located along the top of the walls for mating with the rim 34 to provide a surface for tape sealing the package. Rim 72 at walls 64 and 68 contains latch members 74 and 76 for engaging latch members 36 and 38. Walls 64 and 68 contain indentations located at 61 and 63 above the latches for ease in manipulating the latches. The base 62 also contains two L-shaped parallel cushion retaining tracks 78 and 80 on its inside surface. Base 62 also has an upper planar surface 82 and lower planar surface 84. The upper planar surface 82 extends from the top of the package and is designed to mate with the recess created by the upper planar surface 44 of bottom 10 for stacking purposes.

Figure 3:
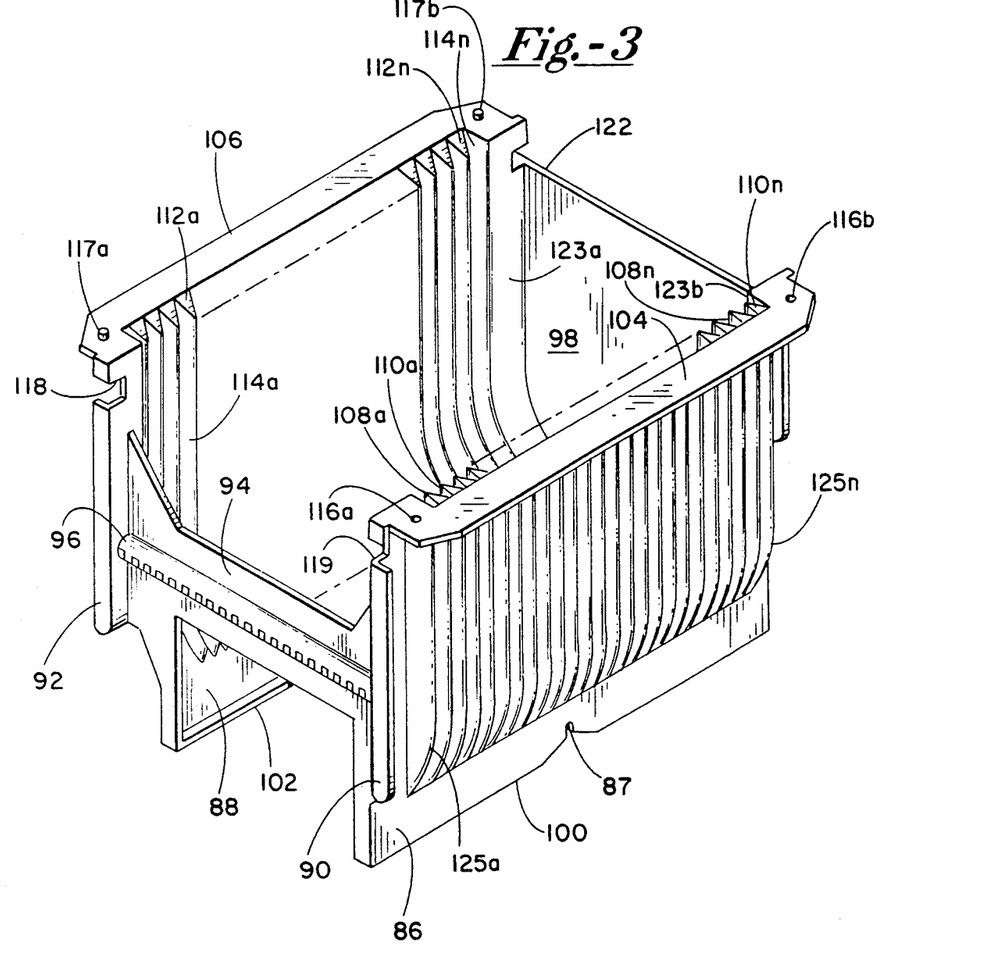
FIG. 3 is a perspective view of a wafer carrier.

FIG. 3 shows a perspective view of the wafer carrier cassette 14. Cassette 14 has opposing sides 86 and 88 with a first support bar 90 extending vertically and outwardly along an end of side 86 and a second support bar 92 extending vertically and outwardly along an end of side 88. A configured "H" shaped member 94 and segmented rod half 96 is located between the support bars 90 and 92 and set back from the support bars 90 and 92. A vertically oriented planar member 98 is located between the rear portions and is flush to the rear portions of sides 86 and 88. Bottom edges 100 and 102 along the bottom portion of sides 86 and 88, respectively each has an indented portion with a recess 87 and 89 for mating with the locator ribs 58 and 60. A planar top edge 104 along the upper edge of side 86 is located between the upper portion of support bar 90 and the upper and outer portion of the planar member 98 and a like planar top edge 106 extends along the upper edge of side 88 between the upper portion of support bar 92 and the upper and outer portion of the planar member 98.

Ribs 108a–108n and alternating wafer pockets 110a–110n extend vertically along the distance between the planar top edge 104 and the lower portion of side 86 near which point the ribs 108a–108n and the alternating wafer pockets 110a–110n assume a curved cross-section to intersect with the lower portion of side 86. In a similar fashion, ribs 112a–112n and alternating wafer pockets 1144a–114n extend vertically for the majority of the distance between the planar top edge 106 the lower portion of side 88 near which point the ribs 108a–108n and the alternating wafer pockets 110a–110n assume a curved cross-section to intersect with the lower portion of side 88. The wafer pocket backs are rounded as shown by 125a–125n to provide for dimensional stability. They extend similarly to assume a curved cross-section to intersect with the lower portion of side 88.

The planar top edges 104 and 106 include vertically oriented positioning holes and slots 116a–116b and 117a–117b, respectively, near outer extremities. The wafer carrier cassette 14 also includes robotic handler slots 118 and 119 positioned in the support bars 90 and 92, respectively, and robotic handler slots 120 and 122 positioned at the rear of the wafer carrier cassette 14 adjacent to the top edge of the planar member 98 and to the upper portions of sides 86 and 88. Robot tab members 123a and 123b are positioned on the upper portion of the sides 86 and 88. The robotic cassette can be used for shipping and storage and/or processing, and can be of a suitable polymer such as polycarbonate, polypropylene, polyethylene, teflon, or other like materials.

Turning now to FIGS. 1, 7, 8 and 9a–d, the cushions 18 and 20 between which the wafers are suspended will be discussed. The cushions are preferably made of elastomer or flexible thermoplastic or other material having properties of minimal flexural creep and loss of elastic memory such as polyvinylidene fluoride (PVDF). More specifically, flexural creep should be within the range of 0.25 to 1.5% deflection at 60° C. when measured in accordance with ASTM test standard D2990. Each cushion has two parallel rails 130 and 132 designed to engage and be retained by the parallel L-shaped tracks of the bottom 10 or of cover 12. Disposed between the two parallel rails 130 and 132 are a plurality of extending members designated generally as 135. The members 135 are spaced according to the spacing of the wafers in the cassette to be packaged and can hold wafers of varying diameter. These members 135 are essentially a plurality of individual flexible cushions for providing cushion for individual wafers.

Figure 9A:
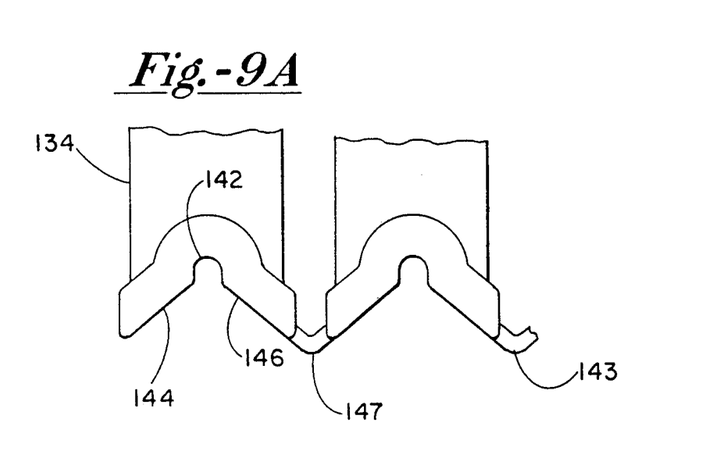
FIGS. 9a-d are enlarged section views showing the various embodiments of the edge of the cushion.
Figure 9B:
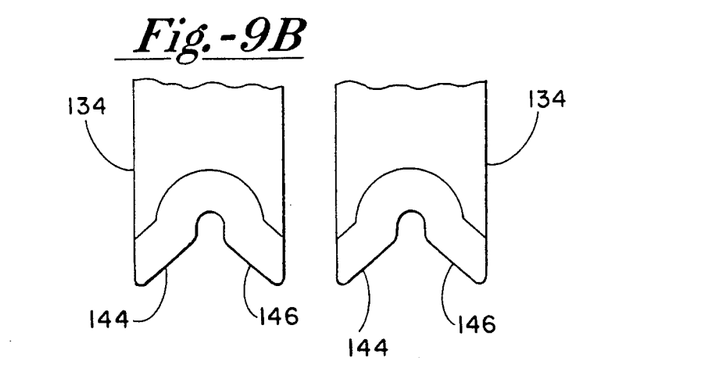

Each member 134 has a first and second leg, 136 and 138, extending transversely from the wafer engaging portion 140 located opposite the rails 130 and 132. The legs 136 and 138 are attached to their respective inside edge 131 and 133 of rails 130 and 132. On each wafer engaging portion 140 is a U-shaped receptacle 142. A first and second angled surface, 144 and 146 respectively, extends outward on either side of the U-shaped receptacle 142 and are used for centering the wafer as described later. FIGS. 9a and 9b show enlarged views of the U-shaped receptacle 142 and angled surfaces 144 and 146. The angled surfaces are connected to the adjacent angled surfaces in the center portion of the cushion as shown at 147, 148 and 149. The connection provides added stability to the cushion. The angled surfaces 144 and 146 of the wafer engaging portion 140 do not need to be continuous. A segmented design of the angled surfaces, shown in FIG. 6c, is an alternative cushion design which still provides the centering function. The cushions are resilient and each member 134 conforms to its respective wafer edge profile, as will be described in further detail later, to securely hold the wafer.

Figure 9C:
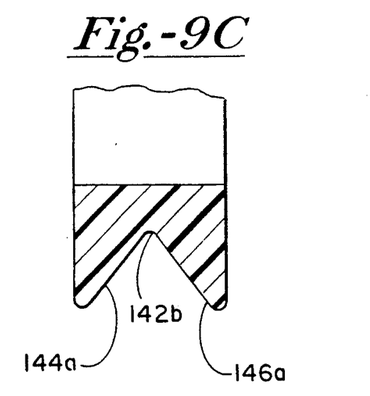
Figure 9D:
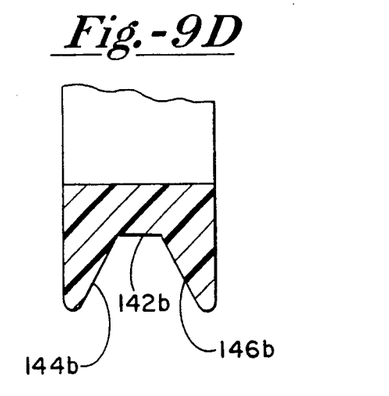

Cushion 20 is secured to the cover by inserting the rails 130 and 132 into the L-shaped tracks 78 and 80 as shown in FIG. 1. Cushion 18 is secured to the bottom 10 in a comparable way. The cushions 18 and 20 are easily removed from the tracks and can be replaced with a cushion having the appropriate spacing for the plurality of wafers to be suspended. FIGS. 9C and 9D show optional cross sectional configurations of the cushion. FIG. 9C contains angled surfaces 144a and 146a to help center the wafer edge into the V-shaped receiving area 142b. Likewise FIG. 9D contains angled surfaces 144b and 146b to help center the wafer edge into the flat surfaced receiving area 142b.

The present invention has several alternative embodiments which pertain to the placement of the wafers and cushions in the interior of the box.

Figure 10:
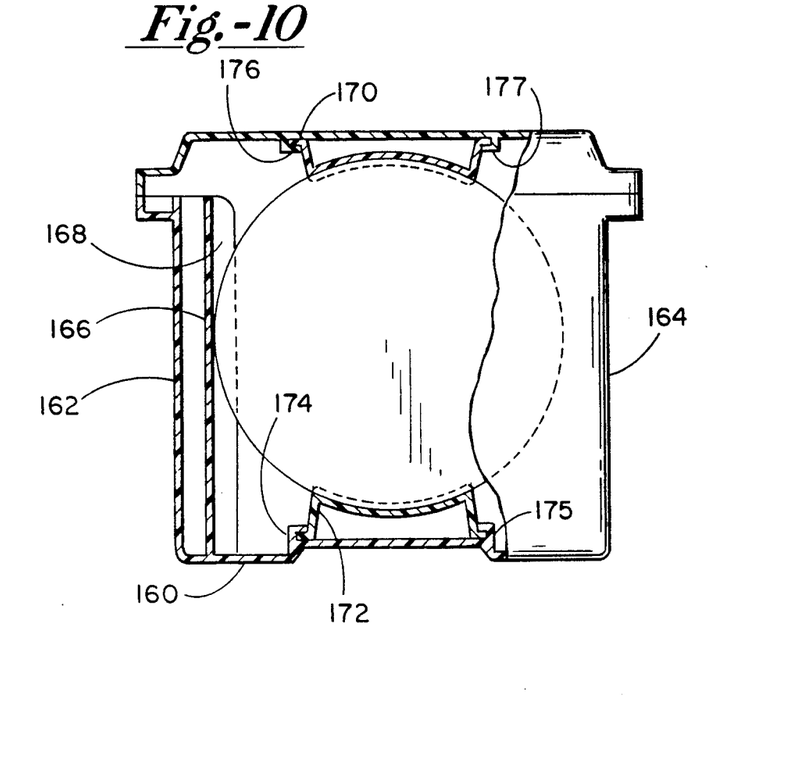
FIG. 10 is a partially cut away cross sectional view of an alternative embodiment of the invention not requiring a wafer carrier.

The first alternative embodiment is shown in FIG. 10. This embodiment eliminates the need for a cassette to hold the wafers. The base 160 contains a plurality of alternating wafer pockets and ribs similar to those found in the cassette of FIG. 2 on side walls 162 and 164. FIG. 10 shows a representative pocket cut away. The pocket has a base wall 166 and side wall 168. The base of this embodiment does not require the channels with locator ribs or a lip with a locator index member for accommodating a cassette. The remaining features are those of the original embodiment of the invention with two cushions, 170 and 172 connected by the L-shaped tracks 174, 175, 176, 177 and the means for stacking capability.

Figure 11:
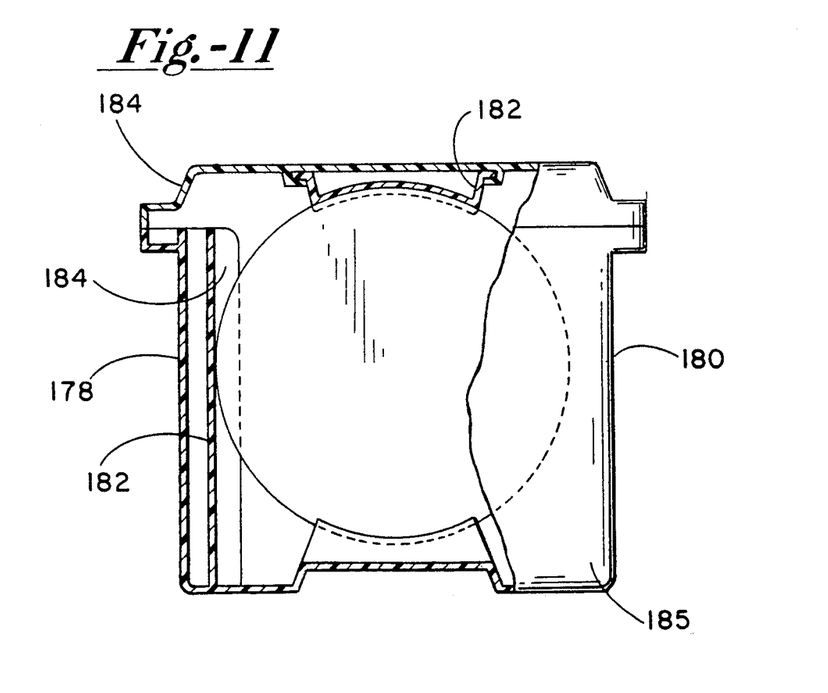
FIG. 11 is a partially cut away cross sectional view of the alternative embodiment of FIG. 10 with only one cushion of the invention.

A second alternative embodiment is shown in FIG. 11. This embodiment is similar to the embodiment in FIG. 10 by eliminating the need for a wafer cassette with a plurality of alternating wafer pockets and ribs located on walls 178 and 180. A representative side pocket on the side is shown cut away with a base wall 182 and side wall 184. This embodiment also contains only one cushion 182. The one cushion is preferably located in the cover 184, but can be located in the base 185. In place of the second cushion is a plurality of wafer pockets similar to those on the side walls 178 and 180. These cushion replacing pockets ideally have a curvature similar to the wafer being held as shown in FIG. 11. It is to be understood that the cushion can be located in the base and the wafer pockets located in the cover.

Figure 12:
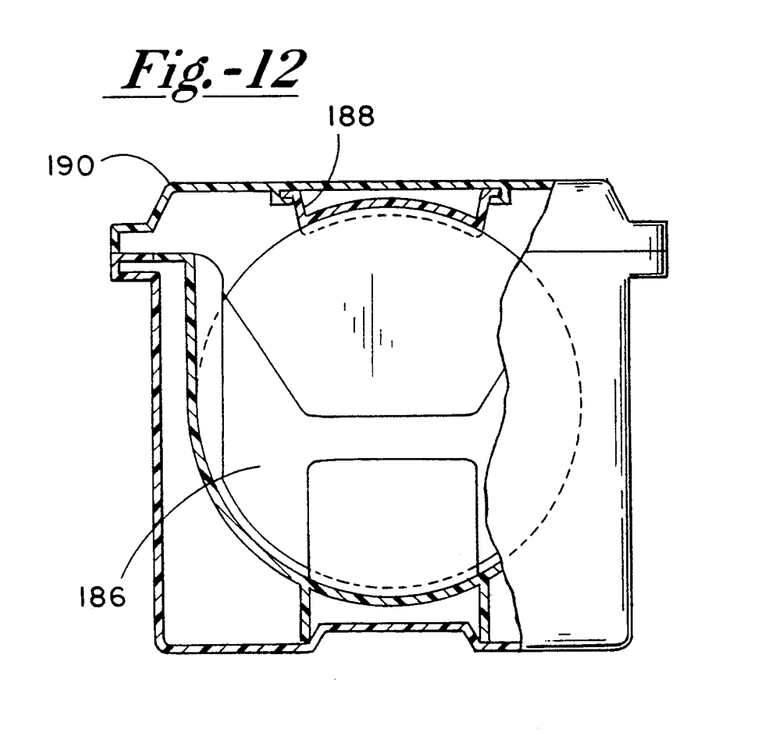
FIG. 12 is a partially cut away cross sectional view of the alternative embodiment with only one cushion.

A third alternative embodiment is shown is FIG. 12. This embodiment incorporates a cassette 186 but only one cushion 188 located in the cover 190. All other features of this third embodiment are comparable to the original embodiment.

MODE OF OPERATION

The wafer carrier cassette 14, including the substrates or wafers 170a-170n, are first placed in the bottom 10 so that the bottom edges 100 and 102 rest in channels 48 and 50 of the bottom 10, the cassette 14 can be properly oriented and aligned in only one position with respect to the bottom 10. The locating index member 56 allows only one proper orientation. The "H" shaped member 94 of the cassette 14 engages over the located indexed member 56. The vertical support bars 90 and 92 position around and about the locating index member 56. At the same time, planar member 98 of the cassette 16 is closely juxtaposed with respect to the side. If the cassette 14 is rotated 180 degrees in either direction about its vertical access, the planar member 98 of the cassette 14 would have to fit in the area occupied by the locating index member 56 in order for the wafer carrier, cassette 14 to fit in the bottom 10. Of course, the area of the "H" shaped member 94 below the segmented rod half 96 and between the vertical support bars 90 and 92 is accommodated by the locating index member 56. In the first and second alternative embodiments, the wafers are inserted into the wafer pockets of the bottom.

The cover 12 is then positioned over the carrier containing the substrates or wafers 170a-170n. In order to prevent breakage or scratching of the wafers, the cover should be placed straight onto the bottom 10. The rim 72 of the cove 12 aligns over the rim 34 of the bottom 10.

Figure 6A:
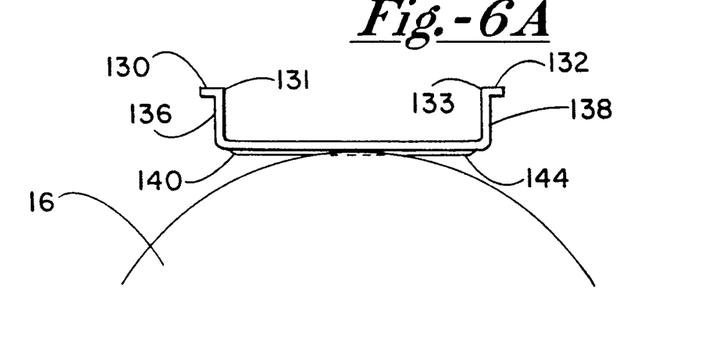
FIG. 6a-c are front views of the wafer profile engaging a cushion of the invention.
Figure 6B:
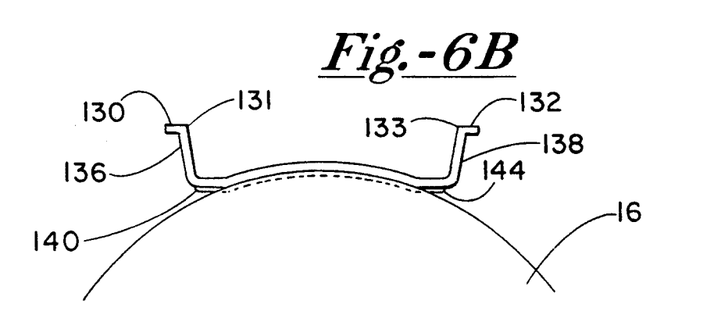
Figure 6C:
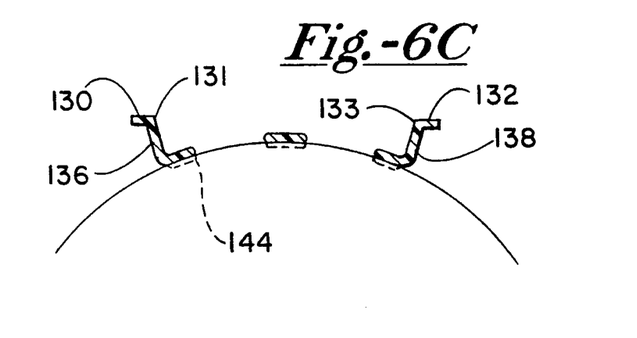
Figure 7:
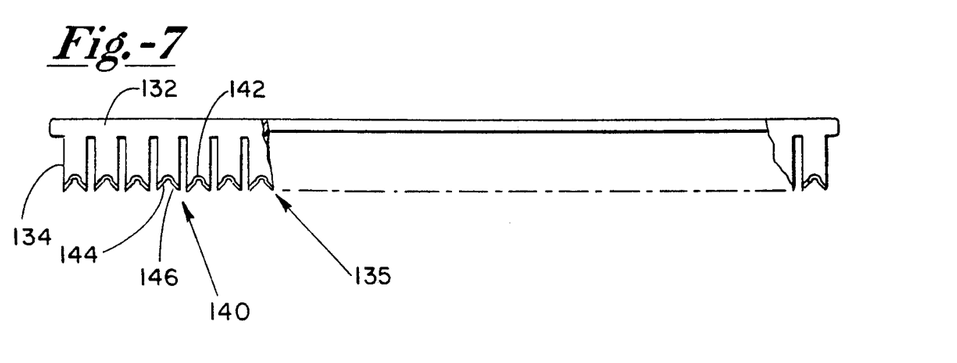
FIG. 7 is a plan view of one of the cushions of the invention.
Figure 8:
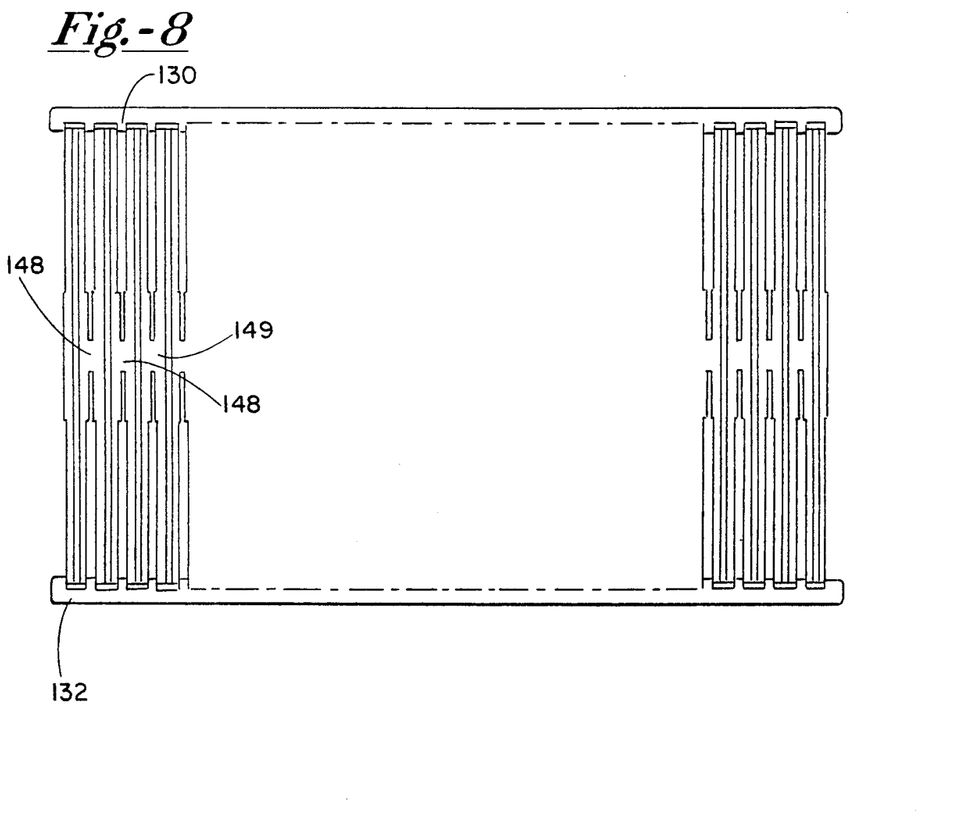
FIG. 8 is a plan view of one of the cushions of the invention.

Each wafer engaging portion 140 conforms about each wafer as shown in FIGS. 6a-c as the wafers are received in the respective U-shaped receptacle 142. The first and second angled surfaces 144 and 146 help center the wafer edge into the U-shaped receptacle. As the cover 12 is positioned incorporating slightly more downward pressure against the substrate wafers 170a-170n the cushions 18 and 20 deform to surround the wafer edge as shown in FIG. 6c to securely and gently hold the wafer edge. The cushions will provide proper cushion for a safe shipment of less than a full cassette of wafers. The wafers of the alternative embodiment engage the cushion or cushions in the same fashion. One cushion is sufficient to meet the objects of the invention because the cushion securely engages the wafers by wrapping around the edge profile and the wafers already secured in the wafer pockets. The wafer cannot slip, pivot or rotate or generating contamination particles once secured.

The cover rim engage about the base rim and the latch members 36, 38, 74 and 76 engage and the interengaging relationship between the cassette 14, the bottom 10, the cover 12, the cushions 18 and 20 and the substrates or wafers 170a-170n occurs during engagement. This interengaging relationship particularly reflects the packages purpose for reducing and eliminating contamination of the wafers, as well as providing for storage and transportation of the substrates and wafers and providing a flush perimeter for taping of the cover 12 and bottom 10 providing for secure shipping and storage.

It is also particularly important to note that the latches are flush, providing that the container is suitable not only being taped, but shrink wrapped or bagged with some suitable type of polyester, polyethylene or mylar film, further providing a non contaminant, container with structural integrity. This also reduces the cost of the container and maintains structural integrity of the wafers supported therein. And lastly, like packages can be stacked by engagement of the recess created by the upper planar member of bottom 10 with the upper planar member of cover 12.

It is understood that the above disclosure and presently preferred embodiment is to be taken as illustrative of the invention. The invention may be readily adapted to package a variety of wafers by changing the cushions. Furthermore, it is to be understood that those skilled in the art be capable of making modifications without departing from the true spirit and scope of the invention.

I claim:

1. A substrate wafer suspension container for suspending a plurality of substrate wafers in a sealable contamination proof container, said container comprising:
    (a) a cover having a first base including four integral walls extending away from said first base;
    (b) a bottom having a second base including four integral sides extending away from said second base and arranged in opposing pairs;
    (c) at least one cushion comprising an elongated channel member having a generally rectangular base with a first and a second major surface, opposing side edges and a pair of side members extending outwardly in the same direction from opposing side edges, said base including a plurality of parallel spaced apart slits extending through the thickness dimension of said base and between said side members accept over a predetermined portion of said base located intermediate said opposing side edges;
    (d) means located on said container for securing said at least one cushion; and
    (e) means located in said container for receiving said plurality of substrate wafers.

2. A substrate wafer suspension container of claim 1 wherein said means for receiving said plurality of substrate wafers is a removable wafer carrier whereby said wafer carrier mates between said top and bottom wherein said plurality of wafers are engaged by said at least one cushion.

3. A substrate wafer suspension container of claim 2 wherein each said plurality of wafer edge engaging receptacles includes a first and a second angled surface on either side of each said wafer edge engaging receptacle.

4. Substrate wafer suspension of claim 1 wherein said means for receiving said plurality of substrate wafers is a plurality of wafer pockets on opposing pairs of said side walls of said bottom.

5. A substrate wafer suspension container of claim 1 wherein said cushion is made of a flexible thermoplastic material.

6. A substrate wafer suspension container for suspending a plurality of substrate wafers in a sealable contamination proof container, said container comprising:
  (a) a cover having a first base including four integral walls extending away from said first base;
  (b) a bottom having a second base including four integral sides extending away from said second base and arranged in opposing pairs;
  (c) at least one cushion having a plurality of extending members with wafer edge engaging surfaces, said cushion is made of polyvinylidene fluoride (PVDF);
  (d) means located on said container for securing said cushion; and
  (e) means located on said container for receiving said plurality of substrate wafers.

7. A substrate wafer suspension container for suspending a plurality of substrate wafers in a sealable contamination proof container, said container comprising:
  (a) a cover having a first base including four integral walls extending away from said first base;
  (b) a bottom having a second base including four integral sides extending away from said second base and arranged in opposing pairs;
  (c) at least one cushion having a plurality of extending members with wafer edge engaging surfaces, said cushion is made of material having flexural creep of less than 1.5% deflection at 60° C. when measured in accordance with ASTM D2990;
  (d) means located on said container for securing said cushion; and
  (e) means located in said container for receiving said plurality of substrate wafers.

8. A substrate wafer suspension container for suspending a plurality of substrate wafers in a sealable contamination proof container, said container comprising:
  (a) a cover having a first base including four integral walls extending vertically from said first base;
  (b) a bottom having a second base including four integral sides extending vertically from said second base;
  (c) a first cushion having a third base, a plurality of members extending from said third base, each said member having a wafer edge engaging surface opposite said third base;
  (d) a second cushion having a fourth base, a second plurality of members extending from said fourth base, each said second member having a second wafer edge engaging surface opposite said fourth base;
  (e) means located on said cover for securing said first cushion to said cover;
  (f) means located on said bottom for securing said second cushion to said bottom; and
  (g) a removable wafer carrier whereby the wafer carrier mates between the top and the bottom with the wafers suspended between the first and second cushion.

9. A substrate wafer suspension container of claim 8 wherein each one of said plurality of wafer edge engaging surfaces includes a first and second angled surface on either side of a U-shaped receptacle.

10. A substrate wafer suspension container of claim 8 wherein each one of said plurality of wafer edge engaging surface comprises a V-shaped receptacle.

11. A substrate wafer suspension container of claim 8 wherein each one of said plurality of wafer edge engaging surface comprises a first and second angled surface on either side of a flat surface.

12. A substrate wafer suspension container of claim 8 wherein said first and second cushions are made of an elastomer material.

13. A substrate wafer suspension container of claim 8 wherein said first and second cushions are made of a flexible thermoplastic material.

14. A substrate wafer suspension container of claim 13 wherein said flexible thermoplastic material is polyvinylidene fluoride (PVDF).

15. A substrate wafer suspension container of claim 8 wherein said first and second cushions are made of a material having flexural creep of less than 1.5% deflection at 60° when measured in accordance with ASTM D2990.

16. A substrate wafer suspension container of claim 8 wherein said means located on said cover for securing said first cushion to said cover comprises of a first set of parallel tracks for receiving said third base of said first cushion.

17. A substrate wafer suspension container of claim 8 wherein said means located on said bottom for securing said second cushion comprises a second set of parallel tracks for receiving said fourth base of said second cushion.

18. A substrate wafer suspension container of claim 17 wherein said box is made of a thermoplastic material.

19. A substrate wafer suspension container of claim 8 wherein said first and second angled surfaces of adjacent members are connected along a central portion of said cushion.

20. A substrate wafer suspension container for suspending a plurality of substrate wafers comprising:
  (a) a package bottom including a first surface, four package bottom sides extending from said first surface, a rim surrounding the four package bottom sides opposite said first surface, first opposing latches on a first and second package bottom opposing side of said four package bottom sides, a raised second surface for package stacking, a first set of parallel tracks for receiving a first cushion on said second surface; and
  (b) a package top including four package top sides, a rim surrounding an edge of said four package top sides, second opposing latch catches on a first and a second package top opposing side of said four package top sides, a top surface including a raised stacking surface, and a second set of parallel tracks for receiving a second cushion;
  (c) said first cushion having a first base, said first base having a first pair of parallel rails for engaging said parallel tracks; a first plurality of members extending from said first base; each one of said plurality of members extending from said first base having a wafer edge engaging surface opposite said first base, said wafer edge engaging surface having a first and second angled surface on either side of a U-shaped receptacle, whereby said first rail engages said first tracks to secure said first cushion to said package bottom;

(d) said second cushion having a second base, said second base having a pair of parallel rails for engaging said second set of parallel tracks; a second plurality of members extending from said second base; each one of said second plurality of members extending from said second base having as second wafer edge engaging surface opposite said second base, said second wafer edge engaging surface having a first and second angled surface on either side of a U-shaped receptacle, where by said second set of rails engages said second set of tracks to secure said second cushion to said package top;

(e) a wafer carrier cassette including opposing closed side walls, a rear wall, and a crossbar connecting the sidewalls; and (f) means on said cassette for positioning said cassette in said package base.

21. A substrate wafer suspension container of claim 20 wherein said first and second cushions are made of polyvinylidene fluoride (PVDF) material.

22. A substrate wafer suspension container of claim 20 wherein said first and second cushions are made of a material having flexural creep of less than 1.5% deflection at 60° C. when measured in accordance with ASTM D2990.

23. A substrate wafer suspension apparatus for suspending a plurality of substrate wafers to be used in combination with a substrate wafer container, said substrate wafer suspension apparatus comprising:

(a) a first and second cushions made of polyvinylidene fluoride (PVDF);

(b) a plurality of members extending from a base;

(c) each said member having a wafer edge engaging surface opposite said base;

(d) said wafer edge engaging surface having a first and second angled surface on defining a first and second side of a wafer edge receptacle; and (e) means on said base opposite said plurality of members for securing said cushion to said substrate wafer container.

24. A substrate wafer suspension apparatus for suspending a plurality of substrate wafers to be used in combination with a substrate wafer container, said substrate wafer suspension apparatus comprising:

(a) a first and second cushion made of material having a flexural creep of less than 1.5% deflection at 60° C. when measured in accordance with ASTM D2990;

(b) a plurality of members extending from a base;

(c) each said member having a wafer edge engaging surface opposite said base;

(d) said wafer edge engaging surface having a first and second angled surface on defining a first and second side of a wafer edge receptacle; and (e) means on said base opposite said plurality of members for securing said cushion to said substrate wafer.

25. A cushion for insertion into a substrate wafer container comprising:

(a) an elongated channel member having a generally rectangular base with a first and a second major surface, opposing side edges and a pair of side members extending outwardly in the same direction from said opposing side edges, said base including a plurality of parallel spaced apart slits extending through the thickness dimension of said base and between said side members except over a predetermined portion of said base located intermediate said opposing side edges wherein said cushion is made of a polyvinylidene fluoride (PVDF) material.

26. A cushion for insertion into a substrate wafer container comprising:

(a) an elongated channel member having a generally rectangular base with a first and a second major surface, opposing side edges and a pair of side members extending outwardly in the same direction from said opposing side edges, said base including a plurality of parallel spaced a part slits extending through the thickness dimension of said base and between said side members except over a predetermined portion of said base located intermediate said opposing side edges wherein said cushion is made of a material having a flexural creep of less than 1.5% deflection at 60° C. when measured in accordance with ASTM D2990.

* * * * *

UNITED STATES PATENT AND TRADEMARK OFFICE
CERTIFICATE OF CORRECTION

PATENT NO. : 5,273,159
DATED : December 28, 1993
INVENTOR(S) : Barry Gregerson

It is certified that error appears in the above-indentified patent and that said Letters Patent is hereby corrected as shown below:

Column 8, line 54, "accept" should read -- except --.

Column 10, line 26, "60°" should read -- 60° C. --.

Column 11, line 10, "as" should read -- a --.

Title page, item [56], "4,043,504 7/1979 Kudlich" should read -- 4,160,504 7/1979 Kudlich --; and "4,973,488 12/1988 Mortensen" should read -- 4,793,488 12/1988 Mortensen --.

Under item [56], add heading: Foreign Patent Documents and list the following references:

Japan    2/1987    62,033,436
    PCT      10/1992    9,216,964

Signed and Sealed this

Seventh Day of June, 1994

Attest:

BRUCE LEHMAN

Attesting Officer  Commissioner of Patents and Trademarks

UNITED STATES PATENT AND TRADEMARK OFFICE
CERTIFICATE OF CORRECTION

| | | |
|---|---|---|
| PATENT NO. | : 5,273,159 | Page 1 of 1 |
| APPLICATION NO. | : 07/887965 | |
| DATED | : December 28, 1993 | |
| INVENTOR(S) | : Barry Gregerson | |

It is certified that error appears in the above-identified patent and that said Letters Patent is hereby corrected as shown below:

Col. 8, line 54, delete "accept" and insert --except--

Signed and Sealed this

Twenty-eighth Day of August, 2007

JON W. DUDAS
*Director of the United States Patent and Trademark Office*